United States Patent
Chin et al.

(10) Patent No.: US 7,075,335 B2
(45) Date of Patent: Jul. 11, 2006

(54) LEVEL SHIFTER

(75) Inventors: Sawkiun Chin, Yokohama (JP); Satoru Kodama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 10/950,381

(22) Filed: Sep. 28, 2004

(65) Prior Publication Data

US 2005/0110553 A1    May 26, 2005

(30) Foreign Application Priority Data

Nov. 25, 2003  (JP)  ............................. 2003-394498
Jul. 2, 2004   (JP)  ............................. 2004-197159

(51) Int. Cl.
*H03K 17/16*   (2006.01)
*H03K 19/003*  (2006.01)
*H03K 19/0175* (2006.01)
*H03K 19/094*  (2006.01)

(52) U.S. Cl. ............................ 326/68; 326/26; 326/27; 326/63; 326/82; 326/83; 326/86

(58) Field of Classification Search ............ 326/26–27, 326/63, 68, 82–83, 86
See application file for complete search history.

(56) References Cited

U.S. PATENT DOCUMENTS

| 5,502,412 | A  |   | 3/1996 | Choi et al. |        |
|-----------|----|---|--------|-------------|--------|
| 6,060,904 | A  | * | 5/2000 | Shimoda     | 326/68 |
| 6,433,582 | B1 | * | 8/2002 | Hirano      | 326/68 |
| 6,727,728 | B1 | * | 4/2004 | Bitting     | 326/55 |

* cited by examiner

*Primary Examiner*—Rexford Barnie
*Assistant Examiner*—Jason Crawford
(74) *Attorney, Agent, or Firm*—Oblon, Spivak, McClelland, Maier & Neustadt, P.C.

(57) ABSTRACT

A first and a second semiconductor switching elements are provided in parallel between a first supply voltage and a second negative reference voltage to become conductive based on an input signal. A first and a second high breakdown voltage semiconductor switching elements are provided in serial to the first and second semiconductor switching elements and kept normally conductive. A first current source circuit supplies a first current to the first and second semiconductor switching elements. A second current source circuit is connected in parallel with the first current source to supply a second current only for a certain period of time.

19 Claims, 7 Drawing Sheets

LEVEL SHIFTER

CROSS-REFERENCE TO PRIOR APPLICATIONS

This application is based upon and claims the benefit of priority from the prior Japanese Patent Application No. 2003-394498, filed on Nov. 25, 2003, and the prior Japanese Patent Application No. 2004-197159, filed on Jul. 2, 2004, the entire contents of which are incorporated herein by reference.

BACKGROUND OF THE INVENTION

1. Field of the Invention

The present invention relates to a level shifter operative to convert an input signal into an output signal on a different voltage level.

2. Description of the Related Art

A level shifter is employed in a driver to convert an input signal defined relative to a first reference voltage into a signal defined relative to a second reference voltage (see U.S. Pat. No. 5,502,412 on page 8, left column and FIG. 2, for example). An example of such the level shifter is shown in FIG. 8. This level shifter 10' is operative in accordance with control signals G1, G2, which are generated from an input circuit 20' through application of a certain conversion to an input signal Vin that is defined relative to a first reference voltage GND (0 V). The input circuit 20' is driven under a supply voltage VDD (of 5 [V] in this case) defined relative to the first reference voltage GND.

The level shifter 10' includes p-type high breakdown voltage MOS transistors HMp1 and HMp2, resistors R1 and R2, and a buffer 11 as shown in FIG. 8.

The high breakdown voltage MOS transistor HMp1 has a source connected to the supply voltage VDD, and a drain connected to one end of the resistor R1. The other end of the resistor R1 is connected to a second reference voltage COM (of −90 [V] in this case). Accordingly, a high voltage (VDD−COM=95 [V]) is applied across the source-drain of the high breakdown voltage MOS transistor HMp1. The high breakdown voltage MOS transistor HMp1 is configured to receive the control signal G1 from the input circuit 20' at the gate to be on/off controlled by the control signal G1.

Similarly, the high breakdown voltage MOS transistor HMp2 has a source connected to the supply voltage VDD, and a drain connected to one end of the resistor R2. The other end of the resistor R2 is connected to the second reference voltage COM. Accordingly, a high-voltage (VDD−COM=95 [V]) is applied across the source-drain of the high breakdown voltage MOS transistor HMp2. The high breakdown voltage MOS transistor HMp2 is configured to receive the control signal G2 from the input circuit 20' at the gate to be on/off controlled by the control signal G2. The control signals G1 and G2 have opposite logic levels, which can therefore control the high breakdown voltage MOS transistors HMp1 and HMp2 to become conductive alternately.

A supply voltage (15 [V]) is applied to the buffer 11 relative to the second reference voltage COM. The buffer 11 appropriately converts voltages on nodes N1 and N2 originated from currents flowing in the conducted high breakdown voltage MOS transistors HMp1 and HMp2 to provide an output signal Vout relative to the second reference voltage COM.

In the above level shifter, the high breakdown voltage MOS transistors HMp1 and HMp2 are required to have a breakdown voltage of tens of [V], which needs an enlarged size and accordingly an increased capacity. In order to elevate the operation speed in such the level shifter, a large driving current is required to flow in the transistors HMp1 and HMp2. The flow of the large driving current, however, invites a problem associated with an increased consumption power. In contrast, in order to reduce the consumption power, the operation speed should be lowered. Thus, the above level shifter has a trade-off between the reduction in consumption power and the high-speed operation, which are hardly achieved at the same time.

SUMMARY OF THE INVENTION

The present invention provides a level shifter configured to convert an input signal having an amplitude varying between a first reference voltage and a first supply voltage into an output signal having an amplitude varying between a second negative reference voltage and a second supply voltage. The level shifter comprises a first and a second semiconductor switching elements provided in parallel between the first supply voltage and the second negative reference voltage and configured to become conductive based on the input signal. A first and a second high breakdown voltage semiconductor switching elements are provided in serial to the first and second semiconductor switching elements respectively and kept normally conductive. The first and second high breakdown voltage semiconductor are higher in breakdown voltage than the first and second semiconductor switching elements. A first current source circuit is provided to supply a first current to the first and second semiconductor switching elements. A second current source circuit is connected in parallel with the first current source to supply a second current to the first or second semiconductor switching element only for a certain period of time on reception of a signal employed to switch the first or second semiconductor switching element from a current-blocked state to a current-allowed state. Finally, an output circuit is provided to create the output signal based on an electric signal originated from a current flowing in the first and second semiconductor switching elements.

DETAILED DESCRIPTION OF THE INVENTION

Figure 1:
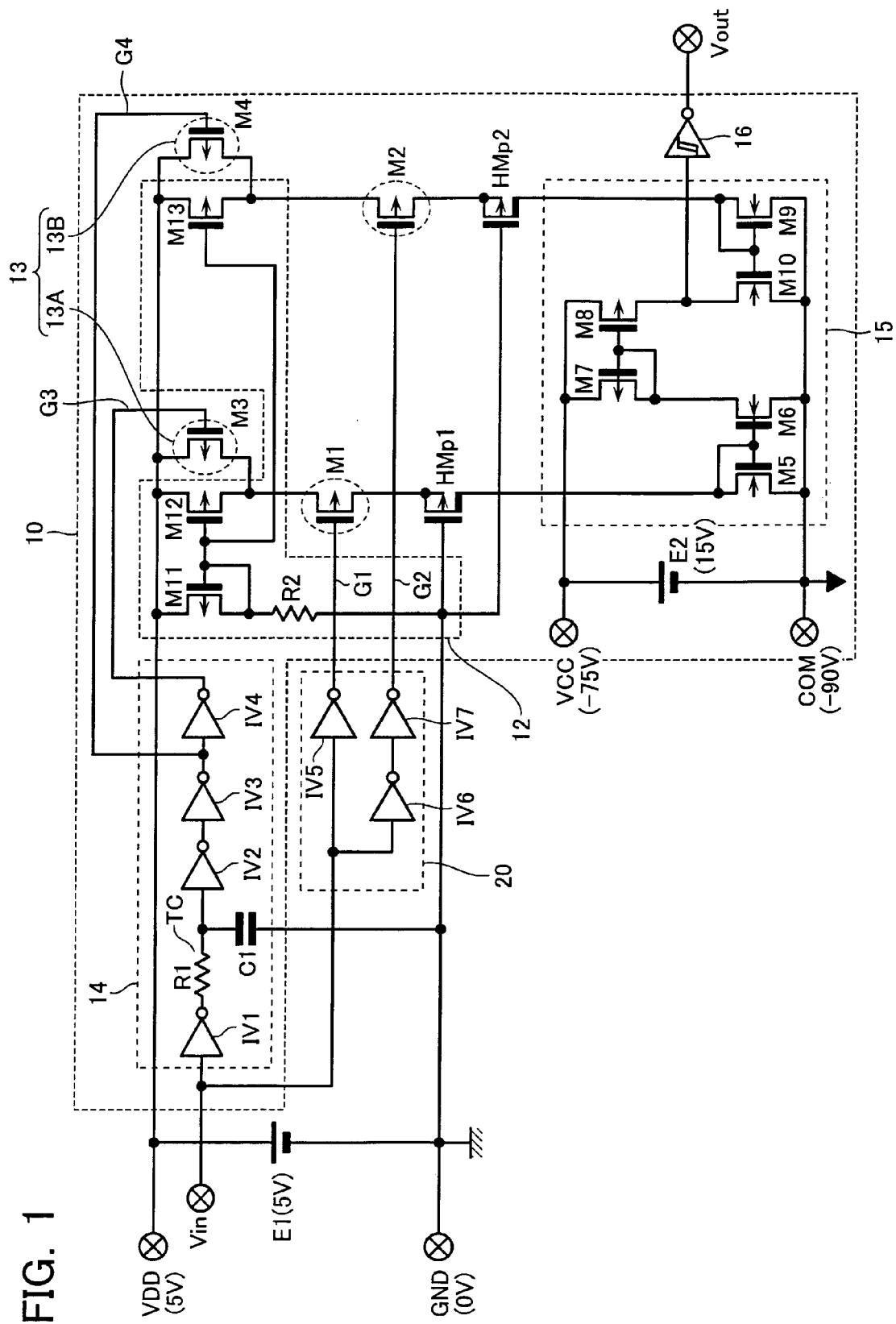
FIG. 1 shows the whole configuration of a level shifter according to a first embodiment of the present invention.
Figure 8:
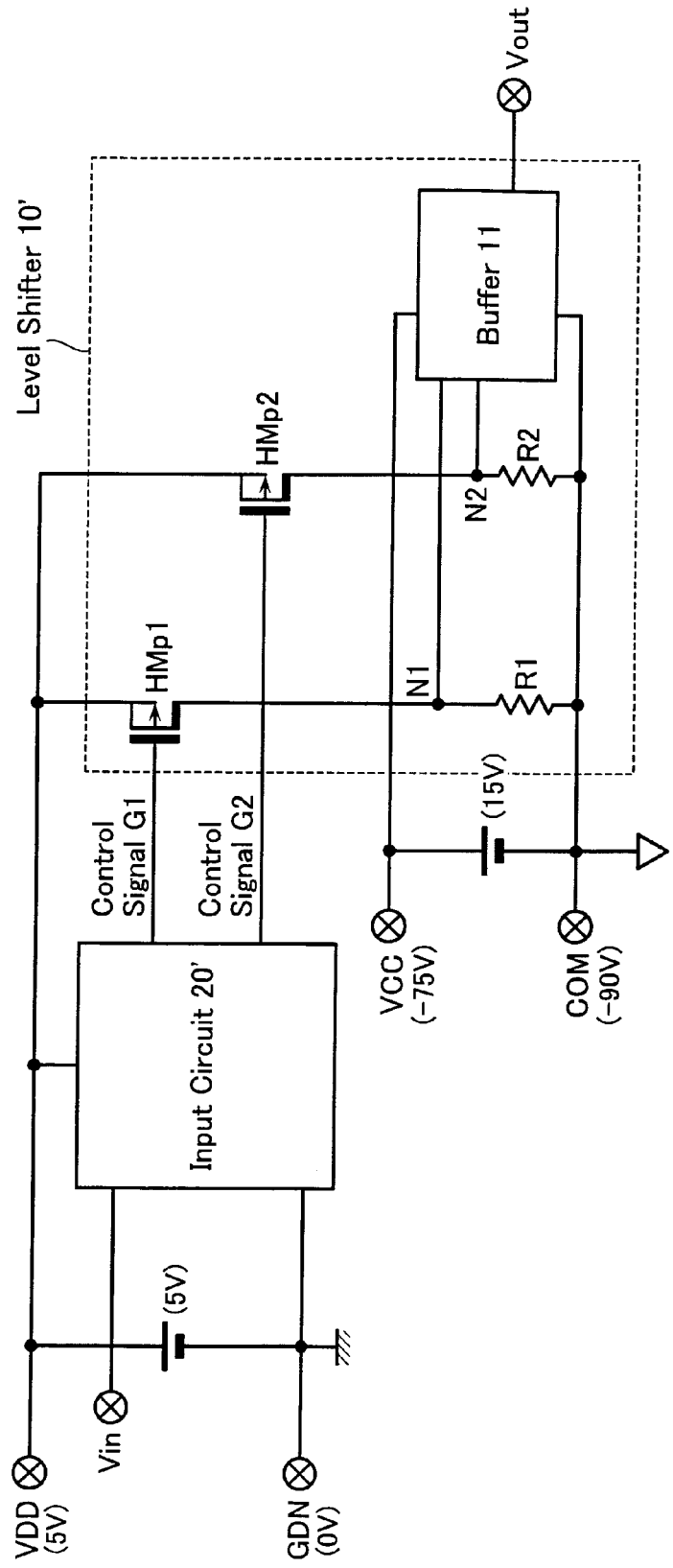
FIG. 8 shows a brief configuration of a level shifter 10' in the art.

A level shifter according to a first embodiment of the present invention will now be described with reference to the drawings. As shown in FIG. 1, the level shifter 10 according to this embodiment includes the high breakdown voltage MOS transistors HMp1 and HMp2 like the prior art (FIG. 8). Similar to that in FIG. 8, it operates based on the control signals G1, G2 generated from an input circuit 20 through application of a certain conversion to the input signal Vin.

In this embodiment, however, the first reference voltage GND (0 [V]) is fixedly applied to the gates of both the transistors HMp1 and HMp2 to keep both the transistors HMp1 and HMp2 normally conductive. This point is different from that in FIG. 8. While both the transistors HMp1 and HMp2 are kept normally conductive, the level shifter 10 of this embodiment includes p-type MOS transistors M1 and M2 connected in serial to both the transistors HMp1 and HMp2 at the sources.

The level shifter 10 also includes a current source circuit 12, a current source circuit 13, a delay circuit 14 and a current mirror circuit 15. These circuits 12–15 are discussed below together with the MOS transistors M1 and M2.

The MOS transistor M1 is turned on/off by the control signal G1 input to the gate thereof to switch current supply to the high breakdown voltage MOS transistor HMp1. The MOS transistor M2 is turned on/off by the control signal G2 input to the gate thereof to switch current supply to the high breakdown voltage MOS transistor HMp2. The control signals G1 and G2 have opposite logic levels, which allow currents to flow in both the transistors HMp1 and HMp2 alternately.

The current source circuit 12 is connected between the MOS transistor M1 or M2 and the supply voltage VDD (power source E1 (5 [V])) to supply currents in the high breakdown voltage MOS transistors HMp1 and HMp2 when the MOS transistors M1 and M2 become conductive. The current source circuit 12 includes a resistor R2, and a current mirror that contains p-type MOS transistors M11, M12 and M13. The MOS transistor M11 is diode-connected and has a gate connected to gates of the MOS transistors M12 and M13. The transistors M11, M12 and M13 have respective sources supplied with the supply voltage VDD. The MOS transistor M12 supplies a current through the MOS transistor M1 to the high breakdown voltage MOS transistor HMp1. The MOS transistor M13 supplies a current through the MOS transistor M2 to the high breakdown voltage MOS transistor HMp2. The resistor R2 is connected between the drain of the MOS transistor M11 and the first reference voltage GND.

The current source circuit 13 includes a current source 13A composed of a p-type MOS transistor M3, and a current source 13B composed of a p-type MOS transistor M4. The MOS transistor M3 is connected in parallel with the MOS transistor M12 contained in the current source circuit 12. The MOS transistor M4 is connected in parallel with the MOS transistor M13 contained in the current source circuit 12.

The current source 13A supplies current to the high breakdown voltage MOS transistor HMp1 independent of the current source circuit 12. This current supply is only for a certain period of time after the instant when the high breakdown voltage MOS transistor HMp1 transits from a current-blocked state to a current-allowed state (namely, when the MOS transistor M1 is turned on). Similarly, the current source 13B supplies current to the high breakdown voltage MOS transistor HMp2 independent of the current source circuit 12. This current supply is only for a certain period of time after the instant when the high breakdown voltage MOS transistor HMp2 transits from a current-blocked state to a current-allowed state (namely, when the MOS transistor M2 is turned on). Therefore, the MOS transistors M3 and M4 are configured to operate alternately under the control of the delay circuit 14, which is discussed next.

The delay circuit 14 plays a role to define the length of the time period during which the current source circuit 13 operates. The delay circuit 14 includes a plurality of (four in this case) chained inverters IV1–IV4 and a RC time constant circuit TC. The RC time constant circuit TC has a time constant determined from the resistance of a resistor R1 and the capacitance of a capacitor C1.

Thus, the delay circuit 14 provides a delayed signal, which is delayed relative to the input signal Vin given to the input terminal for a timing corresponding to the time constant. The MOS transistor M3 receives the output signal G3 from the inverter IV4 as a control signal input to the gate. On the other hand, the MOS transistor M4 receives the output signal G4 from the one-stage previous inverter IV3 as a control signal input to the gate. Thus, the MOS transistors M3 and M4 are controlled to operate alternately as described above.

The current mirror circuit 15 is connected to the high breakdown voltage MOS transistors HMp1 and HMp2 at the drains to generate currents proportional to those flowing in the high breakdown voltage MOS transistors HMp1 and HMp2. The current mirror circuit 15 includes n-type MOS transistors M5 and M6, p-type MOS transistors M7 and M8, and n-type MOS transistors M9 and M10. The MOS transistor M5 is diode-connected and has a drain connected to the high breakdown voltage MOS transistor HMp1, and a source connected to the second reference voltage COM. The MOS transistor M5 has a gate connected to a gate of the MOS transistor M6. The MOS transistor M6 has a source connected to the second reference voltage COM. Similarly, the MOS transistor M9 is diode-connected and has a drain connected to the high breakdown voltage MOS transistor HMp2, and a source connected to the second reference voltage COM. The MOS transistor M9 has a gate connected to a gate of the MOS transistor M10. The MOS transistor M10 has a source connected to the second reference voltage COM.

The MOS transistors M7 and M8 on the other hand have respective sources connected to a supply voltage VCC (of −75 [V] in this case) defined relative to the second reference voltage COM, and respective drains connected to the MOS transistors M6 and M10, respectively. The MOS transistor M7 is diode-connected and has a gate connected to a gate of the MOS transistor M8. The MOS transistor M8 has a drain connected to the input terminal of a Schmitt inverter 16, which provides an output signal as the output signal Vout from the level shifter 10. The Schmitt inverter 16 serves as an output circuit together with the current mirror circuit 15, which generates the output signal based on an electric signal originated from the currents flowing in the high breakdown voltage MOS transistors HMp1 and HMp2 alternately. The Schmitt inverter 16 has different threshold voltages on rising and falling of the input signal. This difference serves the purpose of elevating a malfunction margin against a time variation (dV/dt) in the second reference voltage COM or the drain voltages on the high breakdown voltage MOS transistors HMp1 and HMp2.

When current flows in the high breakdown voltage MOS transistor HMp1, this current is mirrored from the MOS transistor M5 to the MOS transistors M6, M7 and M8 to provide the output voltage Vout based on the current from the Schmitt inverter 16. Similarly, when current flows in the high breakdown voltage MOS transistor HMp2, this current is mirrored from the MOS transistor M9 to the MOS transistor M10 to provide the output voltage Vout based on the current from the Schmitt inverter 16. The MOS transistors M5–M10 are appropriately adjustable in size ratio.

The input circuit 20 includes an inverter IV5 for once inverting the input signal Vin to generate the control signal G1, and inverters IV6 and IV7 for twice inverting the input signal Vin to generate the control signal G2 as shown in FIG. 1. Thus, the control signals G1 and G2 have opposite logic levels, which allow the MOS transistor M1 and M2 to become conductive alternately.

Operation of the level shifter 10 in FIG. 1 is described with reference to a timing chart shown in FIG. 2 and to FIG. 3.

Figure 2:
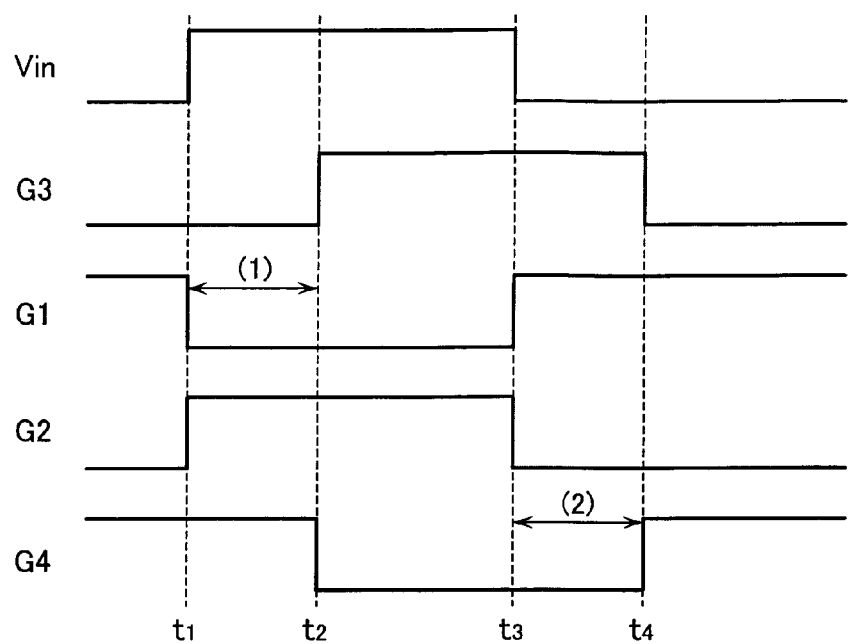
FIG. 2 is a timing chart showing operation of a level shifter 10 shown in FIG. 1.
Figure 3:
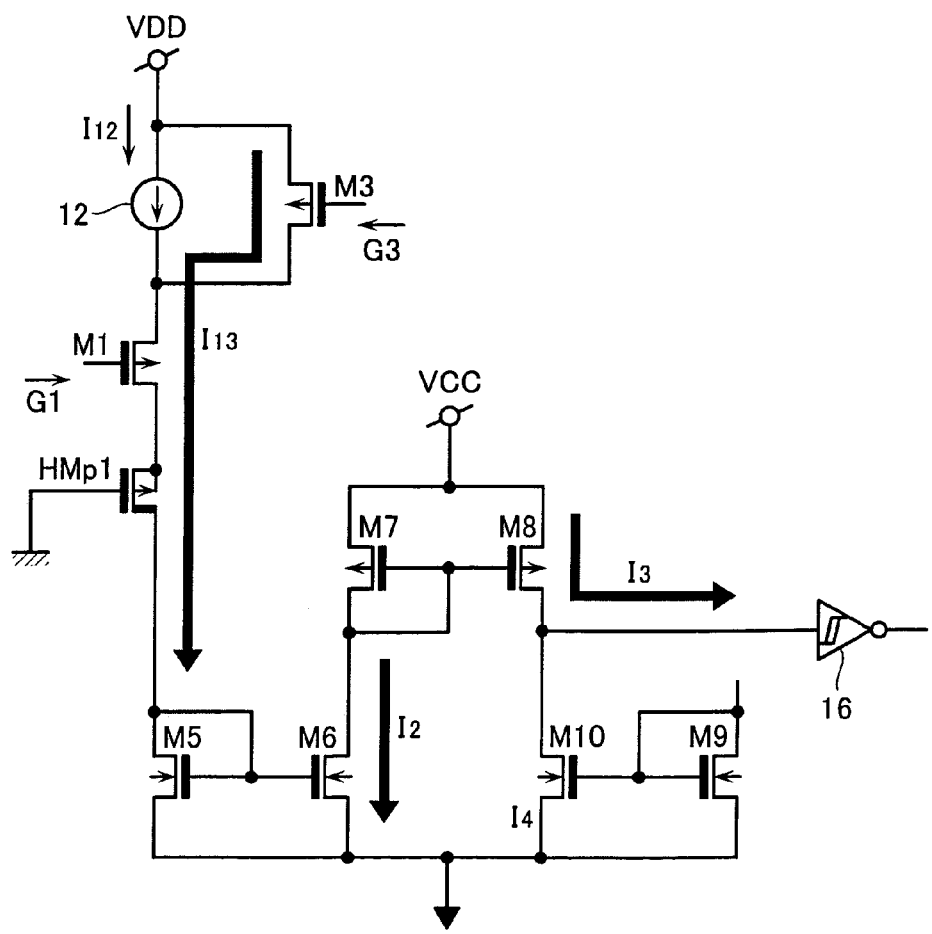
FIG. 3 is a partial circuit diagram showing operation of the level shifter 10 shown in FIG. 1.

As shown in FIG. 2, when the input signal Vin rises from "L" to "H" at time t1, the control signal G1 input to the gate of the MOS transistor M1 falls from "H" to "L". As a result, the MOS transistor M1 is turned on to supply a current I12 from the current source circuit 12 to the high breakdown voltage MOS transistor HMp1. In addition, another current I13 is supplied from the current source circuit 13 (see FIG. 3). A total current of the currents I12 and I13 is mirrored as currents I2 and I3 through the current mirror circuit 15, and the Schmitt inverter 16 provides the output signal Vout.

When the control signal G3 rises from "L" to "H" at time t2 after a delay of a time period (1) (t2–t1), the MOS transistor M3 is turned off to block the supply of the current I13.

Thus, in this embodiment, the current I13 from the current source 13A (or the MOS transistor M3) is supplied only for the period from the time t1, at which the current begins flowing in the high breakdown voltage MOS transistor HMp1, to the time t2. Thereafter, only the current I12 from the current source circuit 12 is supplied. In a word, as a large current is allowed to flow in the high breakdown voltage MOS transistor HMp1 only for the limited time period (1) after the beginning of operation, the power consumed in the level shifter 10 can be reduced. In addition, the flow of the large current during the time period (1) enables a quick charging and a high-speed operation to be achieved in the high breakdown voltage MOS transistor HMp1.

Additionally, in this embodiment the transistor M1 is employed to control the current flowing in the high breakdown voltage MOS transistor HMp1. Accordingly, the delay circuit 14 and the input circuit 20 can be simply composed of the inverters and the RC time constant circuit. If the MOS transistor M3 has a larger size, the current I13 increases correspondingly and enhances the intensity of the total current flowing immediately after the beginning of operation of the high breakdown voltage MOS transistor HMp1.

Similarly, when the input signal Vin falls from "H" to "L" at time t3, the control signal G2 input to the gate of the MOS transistor M2 falls from "H" to "L". As a result, the MOS transistor M2 is turned on to supply a current from the current source circuit 12 to the high breakdown voltage MOS transistor HMp2. In addition, another current is supplied from the current source circuit 13 (current source 13B). When the control signal G4 rises from "L" to "H" at time t4 after a delay of a time period (2) (t4–t3), the MOS transistor M4 is turned off to block the supply of the current from the current source 13B. As for the high breakdown voltage MOS transistor HMp2, it is same as in the high breakdown voltage MOS transistor HMp1 that a large current is supplied only for the limited time period (2) after the beginning of operation. Accordingly, both the reduction in power consumption and the high-speed operation can be achieved at the same time. As for the MOS transistor M4, it is same as in the MOS transistor M3 that if the MOS transistor M4 has a larger size, it can supply a correspondingly large current.

Figure 4:
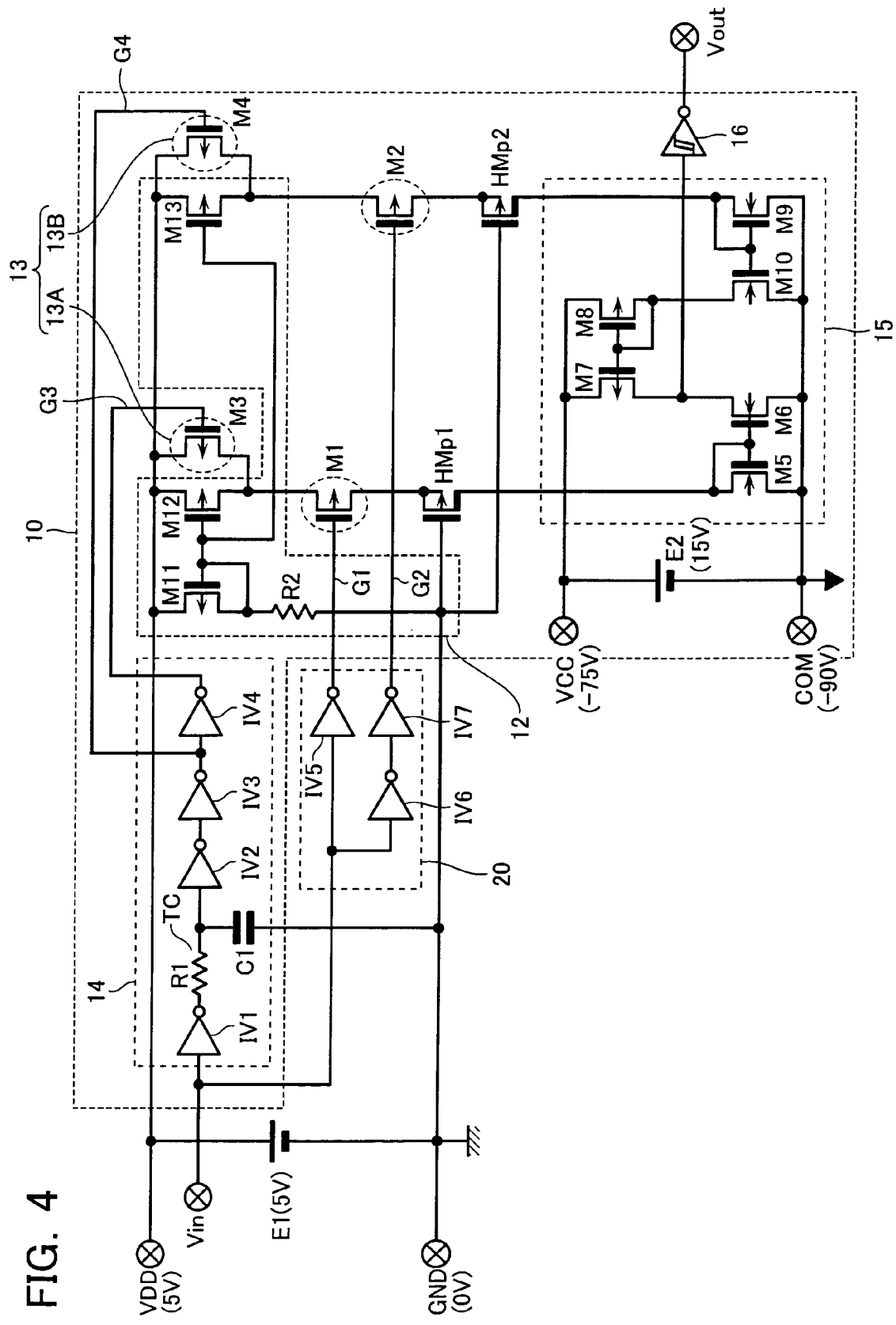
FIG. 4 shows an alternative of the embodiment shown in FIG. 1.

In FIG. 1, the MOS transistor M7 is diode-connected, and the input terminal of the Schmitt inverter 16 is connected to the MOS transistor M8 at the drain. Instead of this connection, the MOS transistor M8 may be diode-connected, and the input terminal of the Schmitt inverter 16 may be connected to the MOS transistor M7 at the drain as shown in FIG. 4. The current mirror circuit 15 may be replaced with the resistors R1 and R2 as shown in FIG. 8. In a word, it may be configured to extract the current flowing in the high breakdown voltage MOS transistor HMp1, HMp2 as an electric signal in one form or another.

Figure 5:
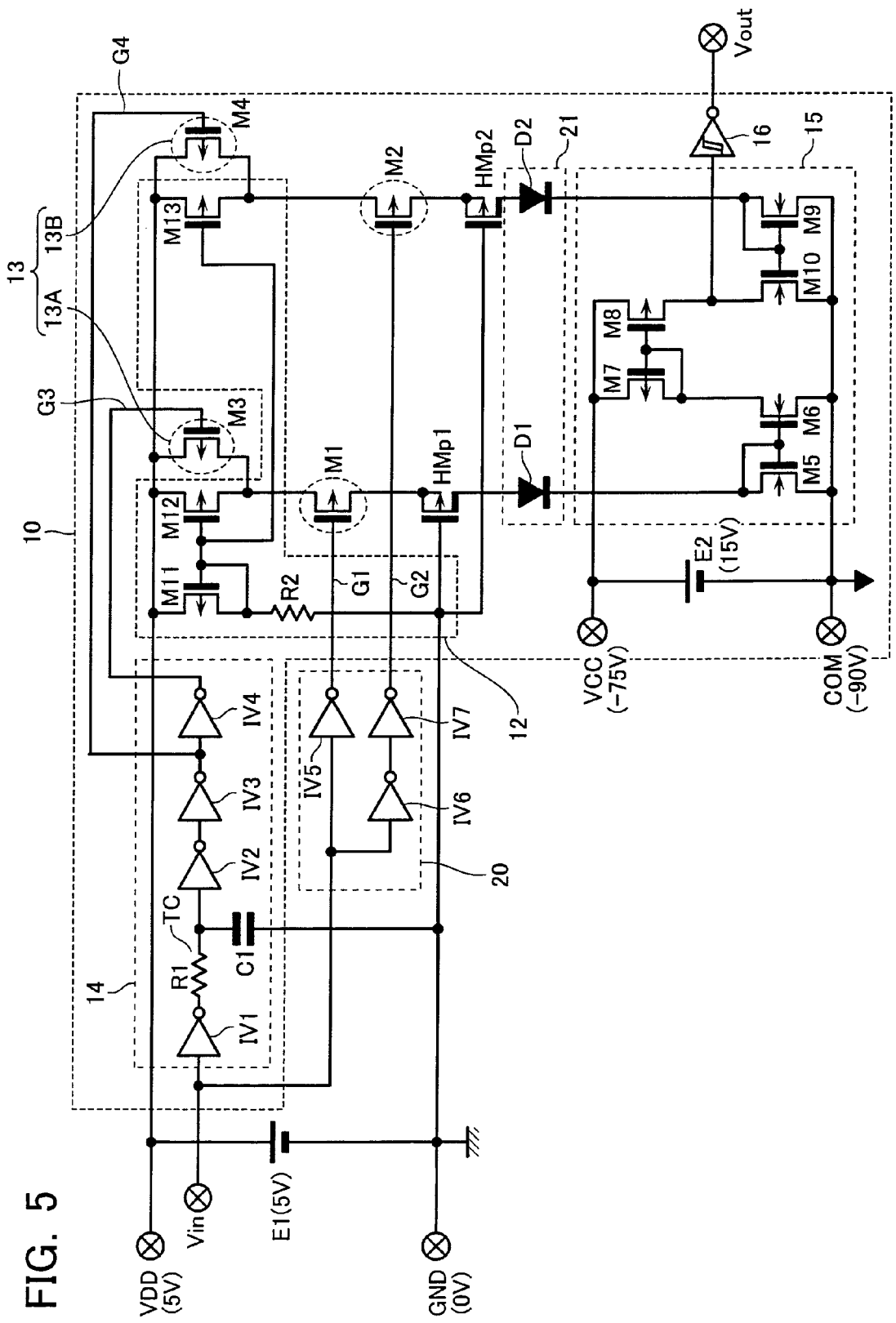
FIG. 5 shows the whole configuration of a level shifter according to a second embodiment of the present invention.

A level shifter according to a second embodiment of the present invention is described in detail with reference to FIG. 5. The same components as those in the first embodiment are given the same reference numerals in FIG. 5 to omit the detailed description thereof.

Different from the first embodiment, the second embodiment includes a reverse current protector 21 composed of diodes D1 and D2. The diodes D1 and D2 are connected in serial to the p-type MOS transistors M1 and M2 respectively, directing anodes to the supply voltage VDD and cathodes to the supply voltage VCC. Thus, even if the second reference voltage COM varies and exceeds the first reference voltage GND due to the operation of the level shifter itself of the embodiment or the invitation of an extraneous voltage noise, it is possible to prevent a reverse current. This is effective to stabilize the operation of the level shifter.

Figure 6:
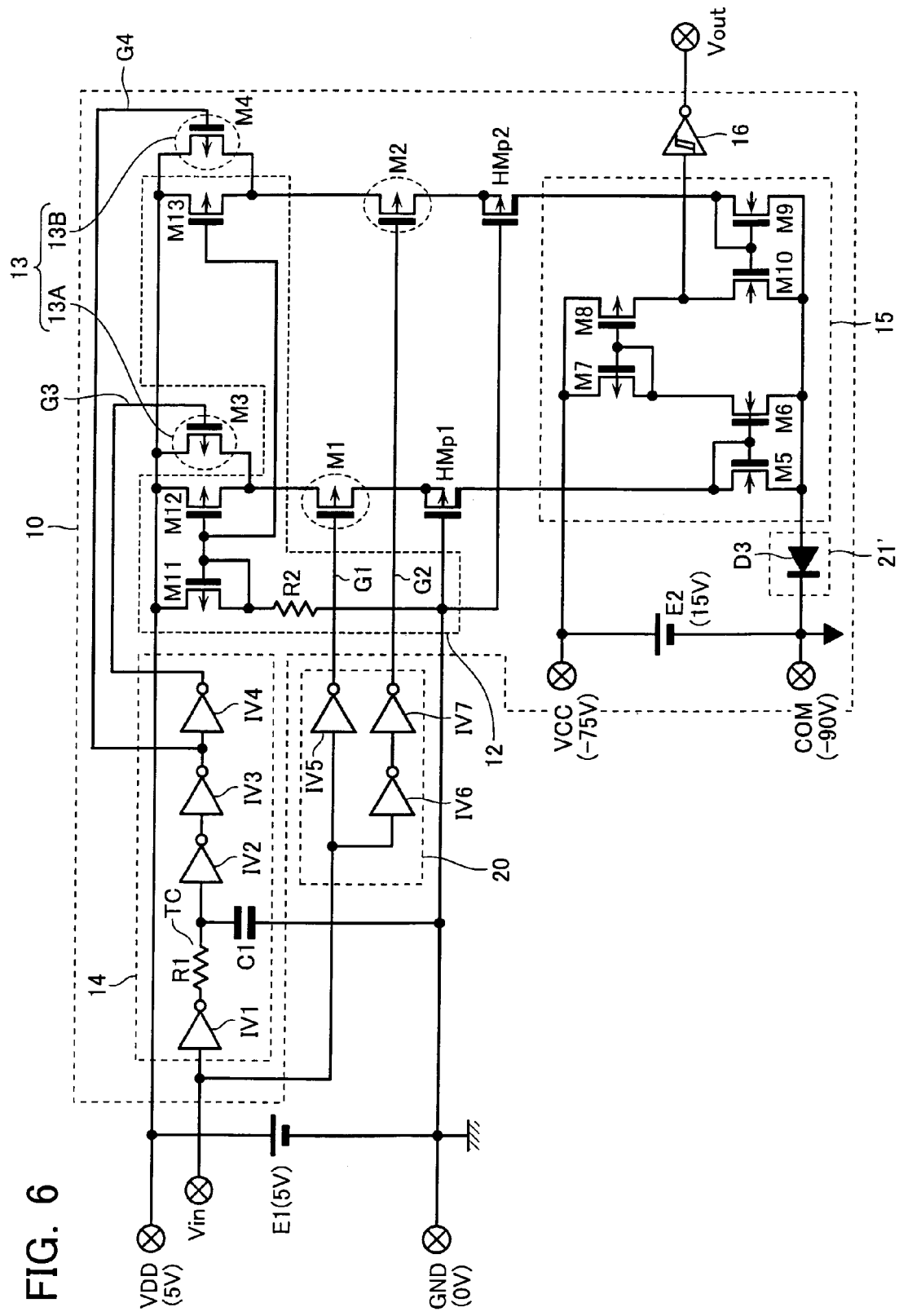
FIG. 6 shows an alternative of the embodiment shown in FIG. 5.

FIG. 6 shows another reverse current protector 21', which may be composed of a single diode D3 if it is connected just behind the terminal of the second reference voltage COM.

Figure 7:
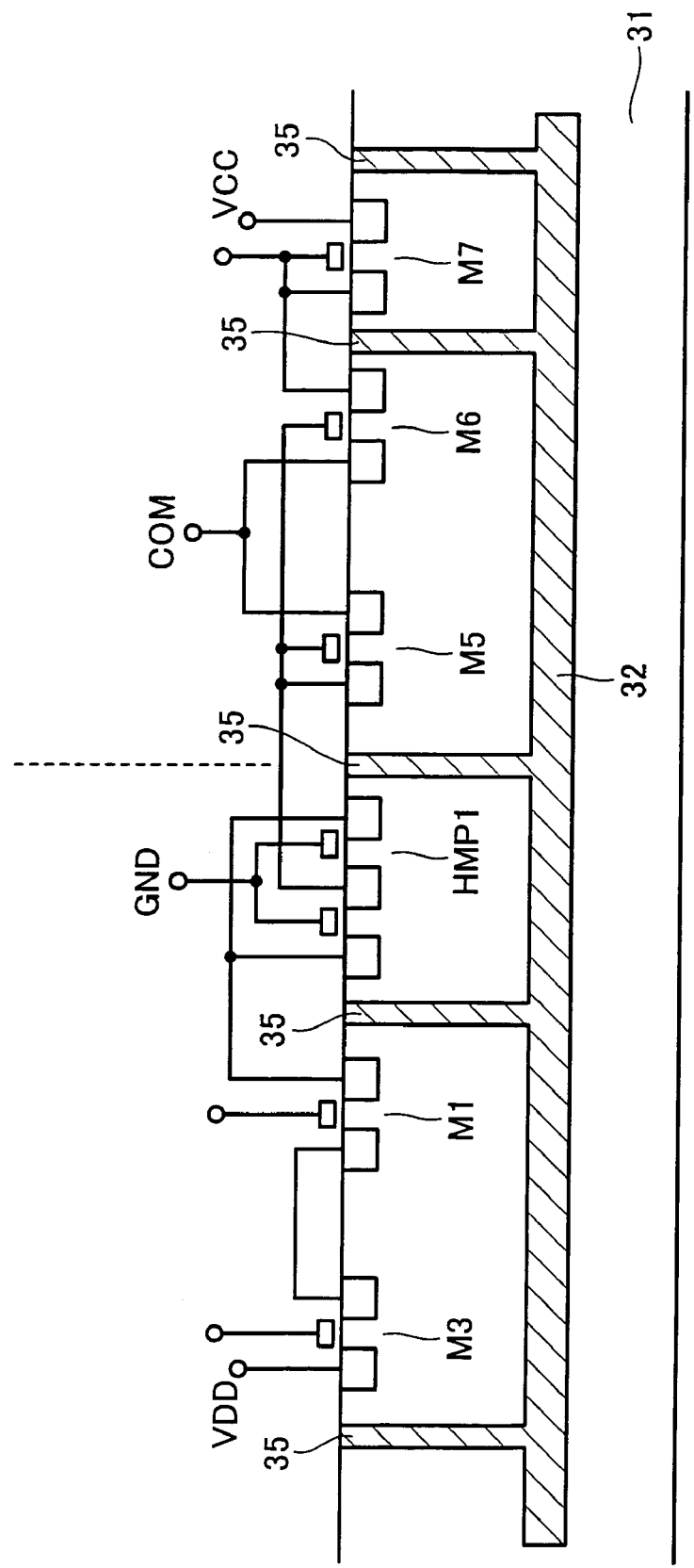
FIG. 7 shows the level shifter according to the embodiment of the present invention formed on an SOI substrate.

The level shifter of the above embodiment is suitably formed on an SOI substrate. Preferably, the transistors contained in the level shifter shown in FIGS. 1 and 4–6 are formed on an SOI substrate composed of a semiconductor substrate 31 and an SOI oxide film 32 as shown in FIG. 7 (the transistors M1, M3, M5–M7 and HMp1 are shown in FIG. 7). In addition, the transistors are isolated from each other by a device isolation film 35. Thus, these transistors can be controlled individually as discrete elements. For example, the voltage on the substrate of the high breakdown voltage MOS transistor HMp1, HMp2 can be controlled without considering any influence on other transistors. Improvements can be expected in reliability of the circuit, including an increase in breakdown voltage of each element. The level shifter can be downsized because high breakdown voltage elements and low breakdown voltage elements can be formed on the same substrate.

FIG. 7 exemplifies a single SOI isolation though a twofold or more SOI isolation may be employed similarly for a high voltage operation.

The embodiments of the invention have been described above while the present invention is not limited to these embodiments. Rather, various modifications, additions and replacements can be devised without departing from the spirit and scope of the invention.

What is claimed is:

1. A level shifter configured to convert an input signal having an amplitude varying between a first reference voltage and a first supply voltage into an output signal having an amplitude varying between a second negative reference voltage and a second supply voltage, said level shifter comprising:

a first and a second semiconductor switching elements provided in parallel between said first supply voltage and said second negative reference voltage and configured to become conductive based on said input signal;

a first and a second high breakdown voltage semiconductor switching elements provided in serial to said first and second semiconductor switching elements respectively and kept normally conductive, said first and second high breakdown voltage semiconductor switching elements being higher in breakdown voltage than said first and second semiconductor switching elements;

a first current source circuit provided to supply a first current to said first and second semiconductor switching elements;

a second current source circuit connected in parallel with said first current source circuit to supply a second current to said first or second semiconductor switching element only for a certain period of time on reception of a signal employed to switch said first or second semiconductor switching element from a current-blocked state to a current-allowed state; and an output circuit provided to create said output signal based on an electric signal originated from a current flowing in said first and second semiconductor switching elements.

2. The level shifter according to claim 1, further comprising a delay circuit operative to delay said input signal for a certain time to generate a delayed signal, wherein said second current source circuit halts supplying said second current based on said delayed signal.

3. The level shifter according to claim 2, wherein said delay circuit includes a RC circuit containing a resistance and a capacitor, said RC circuit having a time constant determined in accordance with a period of time during which said second current source circuit should supply said second current.

4. The level shifter according to claim 2, wherein said first current source circuit is connected in serial to each of said first and second semiconductor switching elements, said first current source circuit including a first and a second p-type MOS transistors having gates to which said first reference voltage is applied.

5. The level shifter according to claim 4, wherein said second current source circuit is connected in serial to each of said first and second semiconductor switching elements, said first current source circuit including a third and a fourth p-type MOS transistors having gates to which said delayed signal of said input signal is provided.

6. The level shifter according to claim 1, wherein said first and second semiconductor switching elements are on/off controlled by a first input signal and a second input signal with an opposite logic level to the first input signal, respectively.

7. The level shifter according to claim 1, wherein
the first reference voltage is fixedly applied to the gates of said first and second high breakdown voltage semiconductor switching elements.

8. The level shifter according to claim 1, further comprising a diode-containing reverse current protector connected in serial to said first and second semiconductor switching elements.

9. The level shifter according to claim 8, wherein said reverse current protector includes a first diode connected in serial to said first semiconductor switching element and a second diode connected in serial to said second semiconductor switching element.

10. The level shifter according to claim 8, wherein said reverse current protector includes a diode connected between said output circuit and a terminal of the second reference voltage.

11. The level shifter according to claim 1, wherein said first and second semiconductor switching elements, said first and second high breakdown voltage semiconductor switching elements, said first current source circuit, said second current source circuit and said output circuit are formed on an SOI substrate and electrically isolated from each other by an insulator film.

12. A level shifter configured to convert an input signal having an amplitude varying between a first reference voltage and a first supply voltage into an output signal having an amplitude varying between a second negative reference voltage and a second supply voltage, said level shifter comprising:

a first and a second semiconductor switching elements provided in parallel between said first supply voltage and said second negative reference voltage and configured to become conductive based on said input signal;

a first and a second high breakdown voltage semiconductor switching elements provided in serial to said first and second semiconductor switching elements respectively and kept normally conductive, said first and second high breakdown voltage semiconductor switching elements being higher in breakdown voltage than said first and second semiconductor switching elements; and an output circuit provided to create said output signal based on an electric signal originated from a current flowing in said first and second semiconductor switching elements.

13. The level shifter according to claim 12, wherein said first and second semiconductor switching elements are on/off controlled by a first input signal and a second input signal with an opposite logic level to the first input signal, respectively.

14. The level shifter according to claim 12, wherein said first reference voltage is fixedly applied to the gates of said first and second high breakdown voltage semiconductor switching elements.

15. A level shifter configured to convert an input signal having an amplitude varying between a first reference voltage and a first supply voltage into an output signal having an amplitude varying between a second negative reference voltage and a second supply voltage, said level shifter comprising:

a first and a second high breakdown voltage semiconductor switching elements provided in parallel between said first supply voltage and said second negative reference voltage;

a first current source circuit provided to supply a first current to said first and second high breakdown voltage semiconductor switching elements;

a second current source circuit connected in parallel with said first current source circuit to supply a second current to said first or second high breakdown voltage semiconductor switching element only for a certain period of time; and an output circuit provided to create said output signal based on an electric signal originated from a current flowing in said first and second high breakdown voltage semiconductor switching elements.

16. The level shifter according to claim 15, further comprising a delay circuit operative to delay said input signal for a certain time to generate a delayed signal, wherein said second current source circuit halts supplying said second current based on said delayed signal.

17. The level shifter according to claim 16, wherein said delay circuit includes a RC circuit containing a resistance and a capacitor, said RC circuit having a time constant determined in accordance with a period of time during which said second current source circuit should supply said second current.

18. The level shifter according to claim 16, wherein said first current source circuit is connected in serial to each of said first and second high breakdown voltage semiconductor switching elements, said first current source circuit including a first and a second p-type MOS transistors having gates to which said first reference voltage is applied.

19. The level shifter according to claim 18, wherein said second current source circuit is connected in serial to each of said first and second high breakdown voltage semiconductor switching elements, said first current source circuit including a third and a fourth p-type MOS transistors having gates to which said delayed signal of said input signal is provided.

* * * * *